US008620605B2

(12) United States Patent
Guilhemsang et al.

(10) Patent No.: US 8,620,605 B2
(45) Date of Patent: Dec. 31, 2013

(54) METHOD FOR IMPROVING FAULT DETECTION AND POSITIONING PRECISION USING REFLECTOMETRY IN A WIRED ELECTRICAL NETWORK

(75) Inventors: Julien Guilhemsang, Creteil (FR); Fabrice Auzanneau, Massy (FR); Yannick Bonhomme, Breuillet (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 581 days.

(21) Appl. No.: 12/810,408

(22) PCT Filed: Dec. 19, 2008

(86) PCT No.: PCT/EP2008/068008

§ 371 (c)(1), (2), (4) Date: Sep. 14, 2010

(87) PCT Pub. No.: WO2009/087045

PCT Pub. Date: Jul. 16, 2009

(65) Prior Publication Data

US 2011/0015882 A1 Jan. 20, 2011

(30) Foreign Application Priority Data

Jan. 3, 2008 (FR) ..................................... 08 50013

(51) Int. Cl.
*G01R 31/11* (2006.01)

(52) U.S. Cl.
USPC .................. 702/59; 702/35; 702/57; 702/58; 702/89; 702/159; 324/527; 324/533; 324/534; 327/141; 327/144; 327/151; 327/153

(58) Field of Classification Search
USPC ............... 702/35, 36, 38, 57, 58, 59, 89, 159; 324/527, 533, 534; 327/141, 144, 151, 327/153

See application file for complete search history.

(56) References Cited

U.S. PATENT DOCUMENTS

| | | | | |
|---|---|---|---|---|
| 4,797,621 | A * | 1/1989 | Anderson et al. | 324/533 |
| 5,162,723 | A * | 11/1992 | Marzalek et al. | 324/76.19 |
| 5,521,512 | A | 5/1996 | Hulina | |
| 5,682,100 | A * | 10/1997 | Rossi et al. | 324/535 |
| 2002/0161542 | A1* | 10/2002 | Jones et al. | 702/108 |
| 2002/0169585 | A1* | 11/2002 | Jones et al. | 702/189 |
| 2004/0044489 | A1* | 3/2004 | Jones et al. | 702/79 |
| 2004/0251912 | A1* | 12/2004 | Pharn et al. | 324/534 |
| 2005/0052190 | A1 | 3/2005 | McCosh | |

FOREIGN PATENT DOCUMENTS

| | | |
|---|---|---|
| EP | 0 652 442 A1 | 5/1995 |
| EP | 0 768 537 A1 | 4/1997 |

* cited by examiner

*Primary Examiner* — Alexander H Taningco
*Assistant Examiner* — Paul D Lee
(74) *Attorney, Agent, or Firm* — Oblon, Spivak, McClelland, Maier & Neustadt, L.L.P.

(57) ABSTRACT

A method for detecting and determining a position of faults using reflectometry in a wired electrical network including: injecting a test signal e(t) into a cable in the electrical network, a timing of successive injections being controlled by a synchronization module that generates an emission clock signal and a reception clock signal; retrieving a reflected signal on the cable; sampling the reflected signal at a frequency Fe=1/Te, where Te is a sampling period; counting a number of samples obtained for the reflected signal and comparing the number of samples obtained with a number n predefined as a function of a length of the cable or the electrical network to be diagnosed, where n is an integer; repeating the injecting, the sampling, and the counting steps N times, shifting the emission clock signal by a duration δ; reconstituting the reflected signal from n*N samples obtained; and analyzing the reconstituted reflected signal to detect a fault.

10 Claims, 3 Drawing Sheets

30 Send diagnostic signal
32 Digitise the output from the DUT
34
36
38 Reconstitute the signal
40 Analysis

METHOD FOR IMPROVING FAULT DETECTION AND POSITIONING PRECISION USING REFLECTOMETRY IN A WIRED ELECTRICAL NETWORK

TECHNICAL FIELD

The invention relates to the field of fault detection in electrical cables and more specifically relates to a method for detecting and determining the position of faults using reflectometry in a wired electrical network comprising the following steps:

injecting a test signal into a cable in said network, retrieving a reflected signal on said cable, sampling said reflected signal at a frequency Fe=1/Te.

The invention also relates to a device adapted for use of the method according to the invention.

The method and device according to the invention are particularly adapted to detecting real time faults in a wired network of an onboard system.

STATE OF PRIOR ART

The increasing integration of complex electronic devices to perform intelligent testing, monitoring and communication operations in real time, particularly in onboard systems, has considerably increased the use of wired electrical networks to input and transfer data.

This development has caused a strong increase in the probability of having a defective electrical network due to external constraints (mechanical, temperature, humidity) applied to power supply and information transfer cables and electrical connectors. These constraints are often the cause of premature deterioration of the electrical network.

Thus, an electrical network may be in failure due to anomalies originating from a connector or an electrical connection in poor condition. Many problems now occur as a result of failures related to wires and can sometimes have serious consequences (fire, aircraft crash, vehicle failure).

Thus, the ability to monitor the condition of electrical connections is an additional advantage to increase the reliability of electrical networks and particularly onboard electrical networks.

The purpose of the invention in this context is to propose a high performance and low cost method and device using reflectometry to monitor the condition of cables in an electrical network with a view towards detection, positioning and characterisation of possible faults with high precision.

Reflectometry is a method based on the principle of radar that consists of injecting a wave into a medium and analysing the reflected wave using wave propagation phenomena in physical media.

In order to use reflectometry for analysing the state of an electrical cable, signals with a short wavelength or wavelength equivalent to the cable length have to be injected into this cable, and this implies the use of high frequency or wide band signals. Reflectometry is done in essentially two analysis domains, Time Domain Reflectometry (TDR) and Frequency Domain Reflectometry (FDR).

One technical problem is due to the fact that the precision of the reflectometry measurement depends on two variables, the sampling rate and the duration of the injected signal.

The measurement precision can be improved by increasing the sampling rate of the measurement system and reducing the duration of the injected signal.

Increasing the sampling rate for an onboard diagnostic device can be difficult and it can introduce severe constraints (increased cost and complexity, consumption, temperature, etc.). The operating rate of sampling devices is of the order of a hundred Megahertz. The diagnostic precision for a coaxial cable varies as follows:

1 m at 100 MHz, 10 cm at 1 GHz, 1 cm at 10 GHz, etc.

A precision of 1 m is not enough for an onboard application, for example for the diagnostic of automobile wiring. A precision of one centimeter will introduce constraints that are difficult to satisfy in the case of an onboard electrical network.

Furthermore, an increase in the sampling rate faces firstly an economic problem due to the cost of components used to digitise high frequency signals and the complexity of using these components, and secondly a technical problem due to the fact that the passband of the cables to be monitored is usually much lower than the passband used by the injected diagnostic signal.

A high voltage signal transport cable is designed to carry energy and is not originally designed to propagate high frequency signals. This results in attenuation of the diagnostic signal, which is larger when the duration of the diagnostic signal is reduced.

Furthermore, it is difficult to detect the fault if the diagnostic signal is excessively attenuated even if the sampling rate of the diagnostic device is correct.

A first purpose of the invention is to improve the precision of the fault detection and positioning technique using reflectometry on a cable in an electrical network.

Another purpose of the invention consists of using the reflectometry technique for fault detection and positioning in an onboard electrical network using a device comprising existing conventional low cost analogue-digital converters operating at frequencies from a few ten of Megahertz to a few hundred Megahertz, easily controllable with an FPGA (Field Programmable Gate Array).

PRESENTATION OF THE INVENTION

These purposes are achieved using a fault detection and positioning method by reflectometry in a wired electrical network comprising the following steps:

injecting a test signal into a cable in said network, retrieving a reflected signal on said cable, sampling said reflected signal at frequency Fe=1/Te, These three steps define an "acquisition phase", repeating the previous steps N times (acquisition phase), where N is an integer number, for each injected test signal, retrieving n samples from the corresponding reflected signal, where n is an integer number, analysing M=n*N retrieved samples to detect and locate a fault in the wired electrical network.

The method according to the invention also comprises a step during which the retrieved samples are compared with an adaptive threshold defined for each diagnostic as a function of the test signal injected in the tested cable.

The invention assumes that the acquired signals are stationary, which is the general case for the envisaged application.

In a first embodiment of the method according to the invention, in each acquisition phase, injection of a test signal into a cable of said network is desynchronised from the start time of said acquisition phase by a duration incremented by a value $\delta$, and the first sample of the reflected signal is retrieved synchronously with the beginning of said acquisition phase, the following samples of said reflected signal being retrieved with a constant delay that is a multiple of the sampling period Te relative to said first sample.

In a second embodiment of the method according to the invention, in each acquisition phase, injection of test signal into a cable of said network is synchronised with the start time of said acquisition phase, and the first sample of the reflected signal is retrieved in a desynchronised manner with regard to the beginning of said acquisition phase by a duration incremented by a value δ, the following samples of said reflected signal being retrieved with a constant delay that is a multiple of the sampling period Te relative to said first sample.

In the case in which 5 is equal to Te/N, the invention is capable of simulating sampling at a frequency N/Te and therefore improving the positioning precision by a factor N.

In a third embodiment of the method according to the invention, in each acquisition phase, injection of a test signal into a cable of said network is desynchronised from the start time of said acquisition phase by a duration incremented by a value δ1, and the first sample of the reflected signal is retrieved in a desynchronised manner with regard to the beginning of said acquisition phase by a duration incremented by a value δ2, the following samples of said reflected signal being retrieved with a constant delay that is a multiple of the sampling period Te relative to said first sample.

The values of the durations δ, δ1 et δ2 are preferably independent of the sampling period Te.

The method according to the invention also comprises a step prior to the analysis of the retrieved samples that consists of reconstituting a signal reflected from said M samples and detecting and positioning a fault in the wired electrical network starting from the analysis of the signal thus reconstituted.

A fault in the wired electrical network is detected and positioned by analysis of each retrieved sample in real time and by processing the results of successive analyses.

According to an additional characteristic of the method according to the invention, the number N is chosen as a function of the required fault detection and positioning precision on an electrical cable.

In one preferred embodiment of the method, the test signal is a rectangular signal.

In this embodiment, the method according to the invention also comprises a step consisting of testing the duration of said rectangular signal.

Alternately, said test signal is composed of a sequence of rectangular signals.

When a fault is detected on a cable in the network, the fault is positioned on said cable as a function of the duration between the instant at which the test signal injected into said cable is sent, and the instant at which the reflected signal corresponding to the fault on said cable arrives.

The method according to the invention is used by means of a device comprising:

- an emission module designed to inject a test signal into a cable of said network a number N of times, where N is an integer number,
- a reception module that will retrieve a reflected signal for each injected test signal, said reception module comprising means of sampling each reflected signal at a frequency Fe=1/Te and storing the acquired values,
- a test module that will analyse the M=n*N samples obtained comprising means of synchronising and desynchronising the emission module and the reception module.

According to the invention, said device also comprises means of comparing said retrieved samples with a adaptive threshold, defined for each diagnostic as a function of the injected test signal and the tested cable.

According to the invention, the test module also comprises a synchronisation module for generating an emission clock and a reception clock, the frequency of said emission clock being desynchronised from the sampling frequency of the reflected signal.

Said synchronisation module is a PLL circuit or a DLL circuit.

A PLL circuit is a phase locked loop to slave the instantaneous output phase onto the instantaneous input phase, and also an output frequency onto a multiple of the input frequency. A DLL (Delay Locked Loop) circuit is a circuit similar to the PLL circuit in which there is no oscillator. This circuit may be used to change the phase of a clock signal.

The emission clock is configured such that each emission is desynchronised from the preceding emission by a duration δ.

In a first variant, the emission clock is configured such that the successive instants at which a test signal is injected into a cable of said network are desynchronised by a duration incremented by δ with respect to the reception clock, and the reception clock determines the instant at which the first sample of the reflected signal is retrieved, the following samples of said reflected signal being retrieved with a constant delay that is a multiple of the sampling period Te relative to said first sample.

In a second variant, the emission clock determines the instants at which the successive injections of a test signal into a cable of said network are made, and the reception clock is configured such that the first sample of the reflected signal for each injected signal is retrieved and desynchronised by a duration incremented by δ relative to the emission clock, the following samples of the reflected signal being retrieved with a constant delay that is a multiple of the sampling period Te relative to the first sample.

In a third variant, the device according to the invention comprises a global clock that controls the operating rate of the system, and the emission clock is configured such that the successive injections of a test signal into a cable in said network are desynchronised from said global clock by an incremented duration δ1, and the reception clock is configured such that for each injected signal, the first sample of the reflected signal is retrieved and desynchronised by a duration incremented by δ2 relative to the global clock, the following samples of the reflected signal being retrieved with a constant delay that is a multiple of the sampling period Te relative to the first sample.

In a fourth variant, the emission clock is configured such that the successive injections of a test signal into a cable of said network are desynchronised from the sampling period Te by a duration δ1, and the reception clock is configured such that the first sample of the reflected signal for each injected signal is retrieved and desynchronised by a duration δ2 from the duration δ1, the following samples of the reflected signal being retrieved with a constant delay that is a multiple of Te relative to the first sample.

Preferably, said synchronisation module is composed of a PLL or a DLL circuit.

BRIEF DESCRIPTION OF THE DRAWINGS

Other characteristics and advantages of the invention will become clear from the following description given as a non-limitative example with reference to the appended figures in which.

DETAILED PRESENTATION OF PARTICULAR EMBODIMENTS

Figure 1:
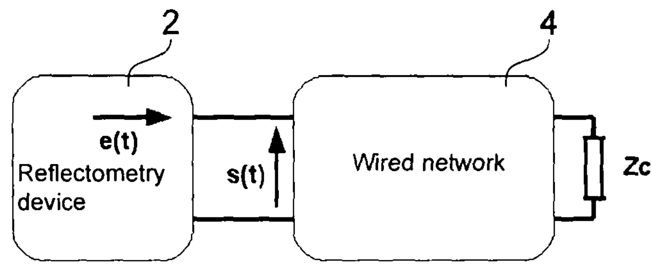
FIG. 1 shows a principle diagram comprising a wired network and a device using the method according to the invention.

FIG. 1 shows a fault detection and positioning device 2 using reflectometry connected to the input of a wired electrical network 4 with a characteristic impedance Zc, for example such as an energy transport network, an electrical network for controlling an industrial process, a wired communication network or even an onboard wired electrical cable fitted on a moving vehicle (aircraft, train, car, etc.).

Figure 2:
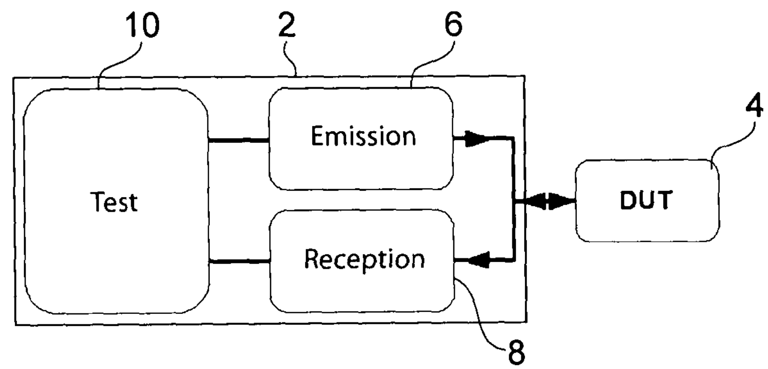
FIG. 2 shows a first embodiment of a device that will implement the method according to the invention, FIG. 3 diagrammatically shows a test module integrated into the device that will use the method according to the invention, FIG. 4 diagrammatically shows a synchronisation module integrated into the test module in FIG. 3.

As can be seen in FIG. 2, the device 2 comprises an emission module 6 designed to inject test signals into the network 4, a reception module 8 designed to retrieve a reflected signal for each injected test signal comprising means of sampling each reflected signal at a frequency Fe=1/Te, and a test module 10 designed to analyse the samples of the reflected signals.

Figure 3:
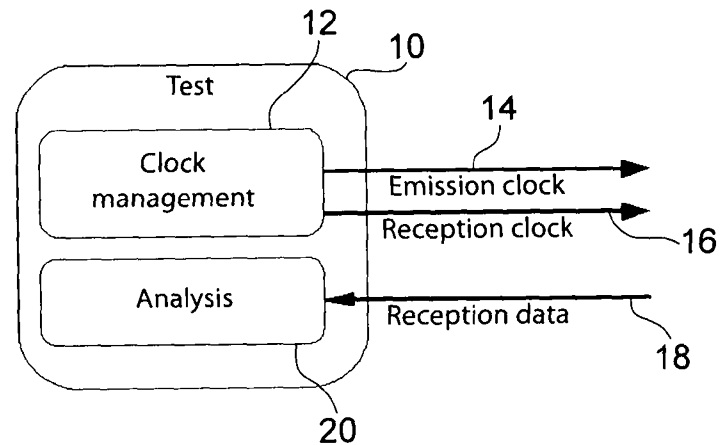

As can be seen in FIG. 3, the test module comprises a synchronisation module 12 that will generate an emission clock signal 14 and a reception clock signal 16 and an analysis module that receives the reflected signals 18.

Figure 4:
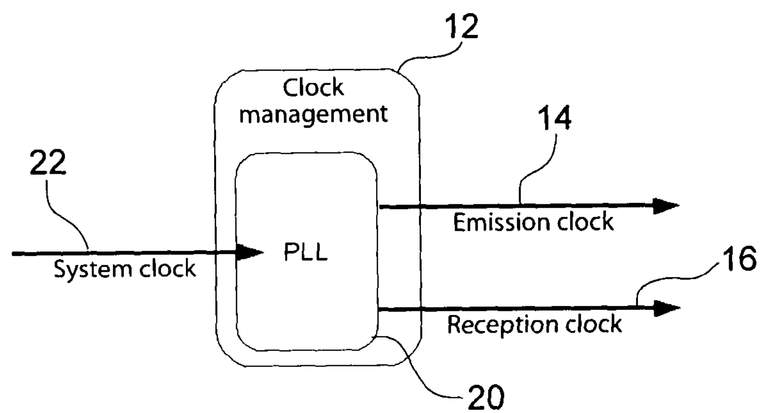

In one preferred embodiment shown diagrammatically in FIG. 4, the synchronisation module 12 is composed of a PLL circuit 20 that generates the emission clock signal 14 and the reception clock signal 16 in a manner known in itself, starting from the operating clock signal 22 of the fault detection device.

During operation, the emission module 2 injects a test signal into the electrical network 4 N successive times where N is an integer number, the successive injections being desynchronised by a very short duration 5 compared with Te (possibly of the order of a few hundred picoseconds or less.) Each signal reflected by the electrical network 4 is sampled at a frequency Fe=1/Te, where Te is the sampling period so as to retrieve n samples for each reflected signal, where n is an integer number.

Let s(t) be the reflected signal, $S_e(k)$ the sampled signal and $T_e$ the sampling period. We then obtain:

$$S_e(k) = \sum_{k=0}^{\infty} s(k * T_e)$$

The invention takes advantage of the fact that if the test signal e(t) is re-injected into the electrical network, then the reflected signal $s_2(t)$ corresponding to the second injected test signal is such that $s_2(t)=s(t)$ (stationary network assumption).

If we introduce a time offset $\delta_2<T_e$ between injection of signal e(t) and when the corresponding reflected signal $s_2(t)$ is sampled, we obtain:

$$\begin{aligned} s_{e2}(k) &= \sum_{k=0}^{\infty} s_2(k * T_e) \\ &= \sum_{k=0}^{\infty} s(k * T_e + \delta_2) \end{aligned}$$

If this operation is repeated N times using $$\delta_i = i * \frac{T_e}{N}, \quad \forall\, i \in [0; n-1] \text{ we obtain:}$$

$$\begin{aligned} \sum_{i=0}^{N-1} s_{ei}(k) &= \sum_{k=0}^{\infty} s_0(k * T_e) + s_1(k * T_e) + \ldots + s_{N-1}(k * T_e) \\ &= \sum_{k=0}^{\infty} s(k * T_e + \delta_0) + s(k * T_e + \delta_1) + \ldots + s(k * T_e + \delta_{N-1}) \\ &= \sum_{k=0}^{\infty} s\left(k * T_e + 0 * \frac{T_e}{N}\right) + s\left(k * T_e + 1 * \frac{T_e}{N}\right) + \\ &\quad \ldots + s\left(k * T_e + (N-1) * \frac{T_e}{N}\right) \\ &= \sum_{k=0}^{\infty} s\left(k * \frac{T_e}{N}\right) \end{aligned}$$

Figure 5:
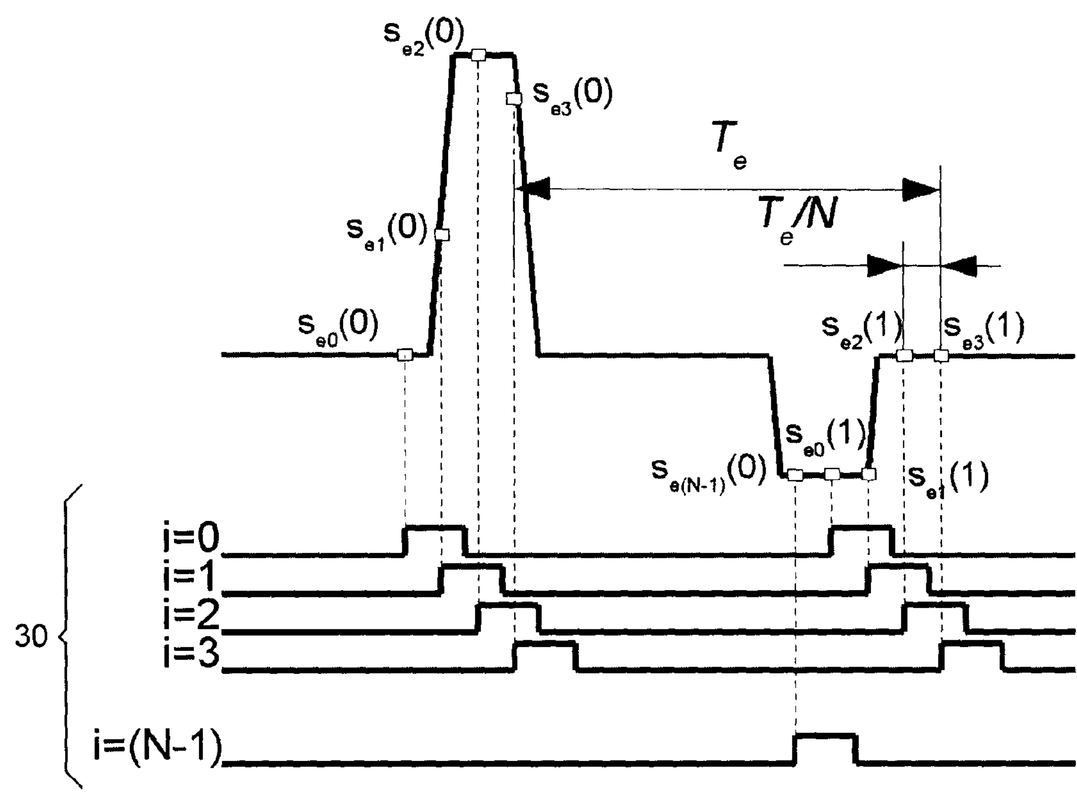
FIG. 5 shows the over sampling principle used by the method according to the invention.

Thus, as shown in FIG. 5, samples of each reflected signal can be combined to obtain a pseudo sampling period of Te/N while maintaining a sampling period Te for each retrieved reflected signal.

In FIG. 5, the test signal is a rectangular signal injected N times successively onto a cable in the electrical network 4. The reflected signal s(t) is sampled at a frequency Fe=1/Te so as to retrieve n samples $s_{ei}(k)$ where i=0 to n−1. The emission clock signal 14 is represented by the N markers 30. The n*N samples $s_{ei}(k)$ are either combined to reconstitute a reflected oversampled signal reflecting the diagnostic curve representing the network cable more precisely, or are analysed individually before reconstitution of the reflected signal so as to obtain a representation of said diagnostic curve by a static analysis of the successive samples.

Thus, for each test signal, the reception module 8 retrieves n*N samples starting from converters operating at a few hundred MHz, or even a few MHz or a few Hz. The measurement precision no longer depends on converters.

More generally, the synchronisation module controls the emission clock signal 14 and the sampling frequency of the reflected signals 16 such that the N successive injections of the test signal are not synchronous with the sampling period Te.

Advantageously, when the test signal is rectangular, the test module 10 tests the width of this signal so as to reduce the attenuation of the reflected signal. This takes account of the physical characteristics of the tested electrical cables.

Figure 6:
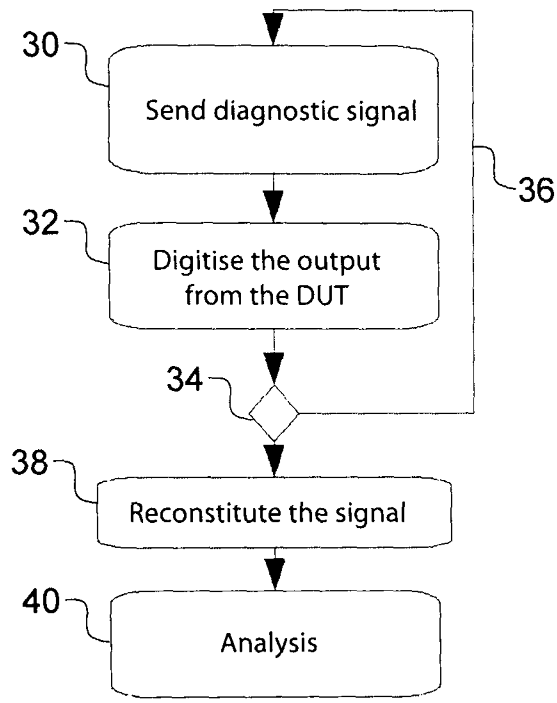
FIG. 6 shows a flowchart illustrating a first embodiment of the method according to the invention.

In a first embodiment illustrated in FIG. 6, the method according to the invention comprises the following steps:

injecting (step 30) a test signal e(t) into a cable in the electrical network 4, sampling (step 32) the reflected signal at a frequency Fe=1/Te, counting the number of samples obtained for the reflected signal and compare (step 34) the number of samples obtained with a number n predefined as a function of the length of the cable or the network to be diagnosed, repeating (arrow 36) steps 30, 32 and 34 N times, shifting the emission clock 14 by a duration δ, reconstituting (step 38) the reflected signal from the n*N samples obtained, analysing (step 40) the reflected signal to detect a fault.

Note that the analysis step 40 may be made using a signal processing algorithm, without departing from the scope of the invention.

In this embodiment, the M=n*N samples obtained are firstly memorised and then used to reconstitute the reflected signal that will be analysed later.

Figure 7:
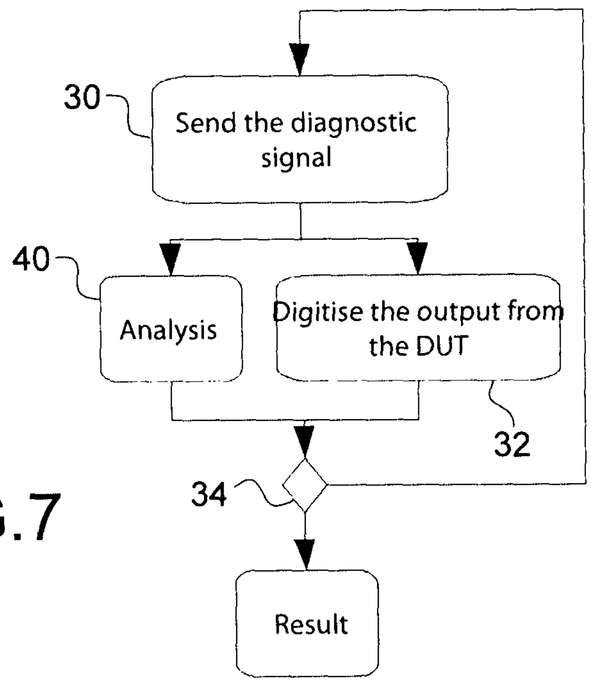
FIG. 7 shows a flowchart illustrating a second embodiment of the method according to the invention.

FIG. 7 shows a second embodiment in which the analysis step 40 is performed in parallel to the sampling step 32. In this case, the signal is not reconstituted, so that the result of positioning the fault can be obtained quickly.

In the example embodiment of the synchronisation module shown in FIG. 4, the PLL circuit used is available in an FPGA and it can generate a minimum time offset between the emission signal and the reception clock signal, the value of which is given by the following expression $$\delta_{min} = \frac{1}{8 \cdot f_{vco}}$$

where $f_{vco}$ represents the frequency of the VCO (Voltage Controlled Oscillator). This frequency can be as high as 1000 MHz for an input frequency of 100 MHz. The result is a minimum time offset $\delta_{min}$=125 ps, which is equivalent to an oversampling frequency of 8 GHz.

However, the desynchronisation is possible from any system capable of testing a time offset between two signals, for example such as a DLL (Delay Locked Loop) circuit or any other circuit, without going outside the framework of the invention.

Note that the method according to the invention can be performed by fixing the reception clock signal and shifting the emission clock signal relative to the sampling signal or by fixing the emission clock signal and shifting the reception clock signal or even shifting the signals of both clocks relative to the sampling signal, without going outside the framework of the invention.

Note also that the device and the method according to the invention used to process the sampled signal use an adaptive threshold that is recalculated for each diagnostic as a function of the input signals, to detect the resulting peaks derived from sampling.

The invention claimed is:

1. A method for detecting and determining a position of faults using reflectometry in a wired electrical network comprising:

injecting a test signal e(t) into a cable in the electrical network, a timing of successive injections being controlled by a synchronization module that generates an emission clock signal and a reception clock signal;

retrieving a reflected signal on said cable;

sampling the reflected signal at a frequency Fe=1/Te, where Te is a sampling period;

counting a number of samples obtained for the reflected signal and comparing the number of samples obtained with a number n predefined as a function of a length of the cable or the electrical network to be diagnosed, where n is an integer;

repeating the injecting, the sampling, and the counting steps N times;

reconstituting the reflected signal from n*N samples obtained, analyzing the reflected signal to detect a fault, wherein, the successive injections of a test signal into a cable of said network are desynchronized from the sampling period Te by a duration δ1, and a first sample of the reflected signal for each injecting signal is retrieved and desynchronized by a duration δ2 from the duration δ1, the following samples of said reflected signal being retrieved with a constant delay that is a multiple of the sampling period Te relative to said first sample.

2. The method according to claim 1, in which a value of at least one of the duration of δ1 or δ2 is independent of the sampling period Te.

3. The method according to claim 1, in which detection and positioning of a fault in the wired electrical network are done by analysis of each retrieved sample in real time and by processing results of successive analyses.

4. The method according to claim 1, in which the number N is chosen as a function of required fault detection and positioning precision.

5. The method according to claim 1, in which the test signal is a rectangular signal.

6. The method according to claim 5, also comprising testing a duration of said rectangular signal.

7. The method according to claim 1, in which said test signal is composed of a sequence of rectangular signals.

8. The method according to claim 1, in which the fault is positioned on the cable as a function of a duration between an instant at which the test signal injected into said cable is sent and an instant at which the reflected signal corresponding to said fault on said cable arrives.

9. A device for fault detection and positioning by reflectometry in a wired electrical network, said device comprising:

a synchronization module that generates an emission clock signal and a reception clock signal;

an emission module that injects a test signal into a cable of said network a number N times, where N is an integer, and a timing of successive injections is controlled by the synchronization module;

a reception module that retrieves a reflected signal for each injected test signal, wherein said reception module samples each reflected signal at a frequency Fe=1/Te, where Te is a sampling period; and a test module that counts a number of samples obtained for the reflected signal and compares the number of samples obtained with a number n predefined as a function of a length of the cable or the electrical network to be diagnosed, where n is an integer, wherein the test module causes the emission module to repeatedly inject N test signals, obtains samples for corresponding N reflected signals, and counts a number of samples corresponding to the N reflected signals, shifting the emission clock signal by a duration δ, wherein the test module reconstitutes the reflected signal from n*N samples obtained, and analyzes the reconstituted reflected signal to detect a fault, and wherein, the successive injections of a test signal into a cable of said network are desynchronized from the sampling period Te by a duration δ1, and a first sample of the reflected signal for each injecting signal is retrieved and desynchronized by a duration δ2 from the duration δ1, the following samples of said reflected signal being retrieved with a constant delay that is a multiple of the sampling period Te relative to said first sample.

10. The device according to claim 9, in which said synchronization module is a PLL circuit or a DLL circuit.

* * * * *